United States Patent
Agarwal et al.

(10) Patent No.: US 10,494,715 B2
(45) Date of Patent: Dec. 3, 2019

(54) ATOMIC LAYER CLEAN FOR REMOVAL OF PHOTORESIST PATTERNING SCUM

(71) Applicant: Lam Research Corporation, Fremont, CA (US)

(72) Inventors: Pulkit Agarwal, Beaverton, OR (US); Purushottam Kumar, Hillsboro, OR (US); Adrien LaVoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/654,612

(22) Filed: Jul. 19, 2017

(65) Prior Publication Data
US 2018/0312973 A1  Nov. 1, 2018

Related U.S. Application Data

(63) Continuation-in-part of application No. 15/582,359, filed on Apr. 28, 2017, now Pat. No. 9,997,371.

(51) Int. Cl.
C23C 16/455 (2006.01)
H01J 37/32 (2006.01)
(Continued)

(52) U.S. Cl.
CPC .. *C23C 16/45527* (2013.01); *C23C 16/45544* (2013.01); *H01J 37/32009* (2013.01);
(Continued)

(58) Field of Classification Search
CPC ............................................ H01L 21/02164
See application file for complete search history.

(56) References Cited

U.S. PATENT DOCUMENTS 4,756,794 A   7/1988  Yoder
6,562,700 B1 *  5/2003  Gu ................... H01L 21/31138
                                                257/E21.228
(Continued)

FOREIGN PATENT DOCUMENTS

JP   06-326060 A   11/1994
JP   2016-532311 A  10/2016
(Continued)

OTHER PUBLICATIONS

U.S. Office Action dated Nov. 29, 2017 issued in U.S. Appl. No. 15/421,189.
(Continued)

*Primary Examiner* — Mohammad M Choudhry
(74) *Attorney, Agent, or Firm* — Weaver Austin Villeneuve & Sampson, LLP

(57) ABSTRACT

Methods and apparatuses for removing photoresist patterning scum from patterning mandrel structures without damaging other features or structures on a semiconductor substrate are desirable for patterning precision. Methods involve cleaning carbon-containing features on a semiconductor substrate by an atomic layer cleaning (ALC) process to descum the carbon-containing features without substantially modifying feature critical dimensions. The ALC process involves exposing the carbon-containing features to an oxidant or reductant in absence of a plasma, or other energetic activation, to modify scum on the surface of the carbon-containing features. The modified scum on the surface of the carbon-containing features is then exposed to an inert gas along with a plasma ignited at a pressure between 0.1 Torr and 10 Torr and a power of less than 200 W to remove the modified scum from the surface of the carbon-containing features.

20 Claims, 9 Drawing Sheets

(51) Int. Cl.
| | |
|---|---|
| *H01L 21/02* | (2006.01) |
| *H01L 43/12* | (2006.01) |
| *H01L 21/033* | (2006.01) |
| *H01L 21/311* | (2006.01) |

(52) U.S. Cl.
CPC .. *H01J 37/32449* (2013.01); *H01L 21/02164* (2013.01); *H01L 21/02263* (2013.01); *H01L 21/0332* (2013.01); *H01L 21/31138* (2013.01); *H01L 43/12* (2013.01); *H01J 2237/334* (2013.01)

(56) References Cited

U.S. PATENT DOCUMENTS

| | | | |
|---|---|---|---|
| 7,416,989 B1 | 8/2008 | Liu et al. | |
| 7,759,239 B1 * | 7/2010 | Lin | H01L 21/0337 257/E21.218 |
| 8,808,561 B2 | 8/2014 | Kanarik | |
| 8,883,028 B2 | 11/2014 | Kanarik | |
| 9,576,811 B2 | 2/2017 | Kanarik et al. | |
| 9,675,811 B2 | 6/2017 | Stahmann et al. | |
| 9,806,252 B2 | 10/2017 | Tan et al. | |
| 9,991,128 B2 | 6/2018 | Tan et al. | |
| 9,997,371 B1 | 6/2018 | Agarwal et al. | |
| 10,269,566 B2 | 4/2019 | Tan et al. | |
| 2002/0051728 A1 * | 5/2002 | Sato | B22F 1/0048 420/562 |
| 2005/0061234 A1 * | 3/2005 | Li | C23C 16/402 117/92 |
| 2005/0208754 A1 * | 9/2005 | Kostamo | C23C 16/40 438/622 |
| 2006/0172530 A1 | 8/2006 | Cheng et al. | |
| 2007/0095367 A1 | 5/2007 | Wang et al. | |
| 2009/0075472 A1 | 3/2009 | Arnold et al. | |
| 2010/0060539 A1 * | 3/2010 | Suetsuna | H01F 1/33 343/787 |
| 2011/0117678 A1 * | 5/2011 | Varadarajan | H01L 21/3105 438/4 |
| 2011/0130011 A1 * | 6/2011 | Sasajima | C23C 16/402 438/770 |
| 2011/0139748 A1 | 6/2011 | Donnelly et al. | |
| 2012/0100308 A1 * | 4/2012 | Milligan | C23C 16/36 427/569 |
| 2014/0120688 A1 | 5/2014 | Booth, Jr. et al. | |
| 2014/0170853 A1 | 6/2014 | Shamma et al. | |
| 2015/0017812 A1 | 1/2015 | Chandrasekharan et al. | |
| 2015/0037972 A1 * | 2/2015 | Danek | C23G 5/00 438/643 |
| 2015/0041809 A1 | 2/2015 | Arnold et al. | |
| 2015/0064917 A1 | 3/2015 | Somervell et al. | |
| 2015/0084156 A1 * | 3/2015 | Ravasio | |
| 2015/0170957 A1 | 6/2015 | Tsao | |
| 2015/0270140 A1 | 9/2015 | Gupta et al. | |
| 2016/0013063 A1 | 1/2016 | Ranjan et al. | |
| 2016/0064244 A1 | 3/2016 | Agarwal et al. | |
| 2016/0135274 A1 | 5/2016 | Fischer et al. | |
| 2016/0203995 A1 | 7/2016 | Kanarik et al. | |
| 2016/0308112 A1 | 10/2016 | Tan et al. | |
| 2016/0358782 A1 | 12/2016 | Yang et al. | |
| 2016/0379824 A1 | 12/2016 | Wise et al. | |
| 2017/0069462 A1 | 3/2017 | Kanarik et al. | |
| 2017/0125256 A1 | 5/2017 | Lee et al. | |
| 2017/0178917 A1 | 6/2017 | Kamp et al. | |
| 2017/0229311 A1 | 8/2017 | Tan et al. | |
| 2017/0316935 A1 | 11/2017 | Tan et al. | |
| 2018/0174860 A1 | 6/2018 | Kanarik | |
| 2018/0308695 A1 | 10/2018 | LaVoie et al. | |
| 2018/0337046 A1 | 11/2018 | Shamma et al. | |
| 2018/0350624 A1 | 12/2018 | Kanarik et al. | |

FOREIGN PATENT DOCUMENTS

| | | |
|---|---|---|
| KR | 10-2016-0136303 | 11/2016 |
| WO | WO 2011/081921 A2 | 7/2011 |

OTHER PUBLICATIONS

Faraz et al., (2015) "Atomic Layer Etching. What Can We Learn from Atomic Layer Deposition?," *ECS Journal of Solid State Science and Technology*, 4(6):N5023-N5032.
U.S. Appl. No. 15/841,205, filed Dec. 13, 2017, Kanarik.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
Kanarik et al. (Mar./Apr. 2015) "Overview of atomic layer etching in the semiconductor industry," *J. Vac. Sci. Technol. A*, 33(2):020802-1-020802-14.
Kanarik et al. (Sep./Oct. 2017) "Predicting synergy in atomic layer etching," *J. Vac. Sci. Technol. A*, 35(5):05C302-1 through 05C302-7.
U.S. Appl. No. 15/421,189, filed Jan. 31, 2017, Tan et al.
U.S. Appl. No. 15/494,245, filed Apr. 21, 2017, Tan et al.
U.S. Appl. No. 15/582,359, filed Apr. 28, 2017, Agarwal et al.
U.S. Notice of Allowance dated Apr. 25, 2018 issued in U.S. Appl. No. 15/421,189.
U.S. Office Action dated Apr. 19, 2018 issued in U.S. Appl. No. 15/494,245.
International Search Report and Written Opinion dated Apr. 5, 2018 issued in Application No. PCT/US2017/066470.
International Search Report and Written Opinion dated Oct. 16, 2018 issued in Application No. PCT/US2018/032783.
U.S. Appl. No. 15/979,340, filed May 14, 2018, Shamma et al.
U.S. Appl. No. 16/049,320, filed Jul. 30, 2018, Kanarik et al.
U.S. Notice of Allowance dated Dec. 13, 2018 issued in U.S. Appl. No. 15/494,245.
U.S. Office Action dated Apr. 10, 2019 issued in U.S. Appl. No. 15/841,205.
International Search Report and Written Opinion dated Nov. 26, 2018 issued in Application No. PCT/US18/42024.
Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.
U.S. Appl. No. 16/361,083, filed Mar. 21, 2019, Tan et al.

* cited by examiner

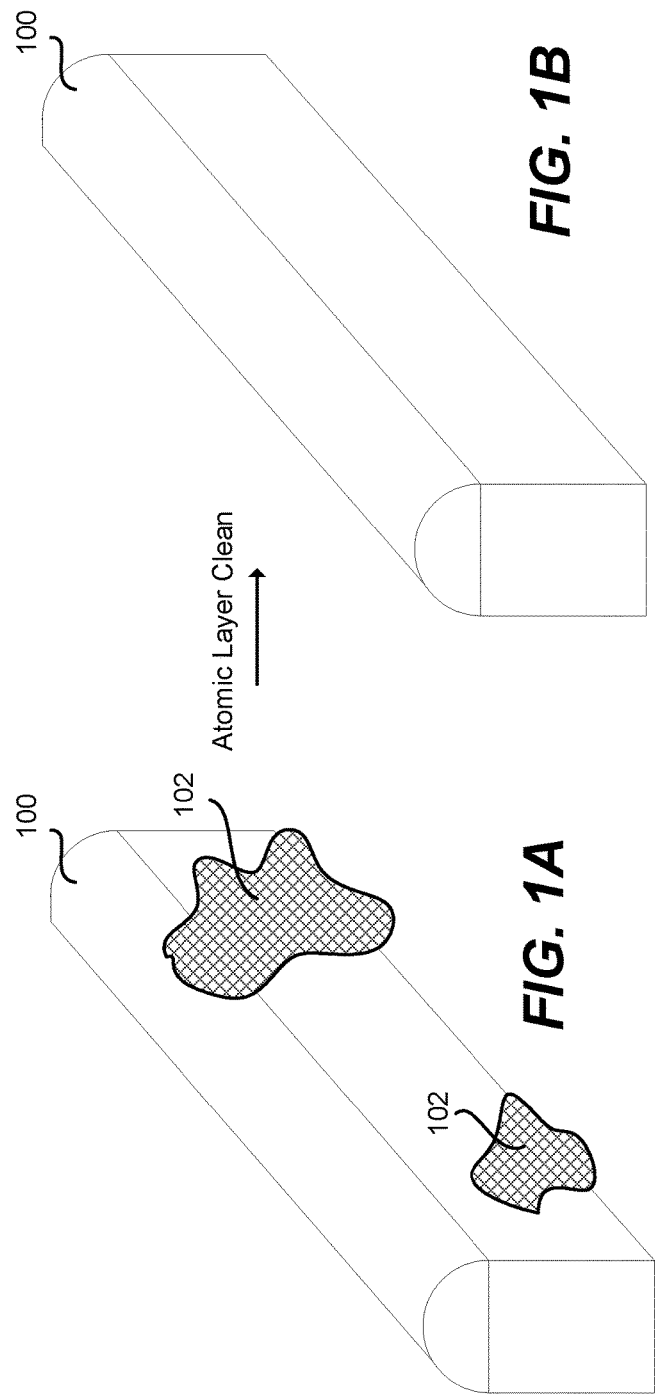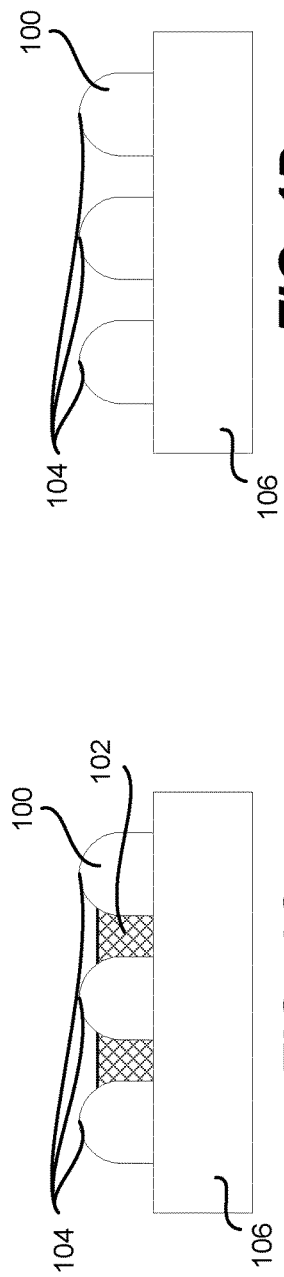

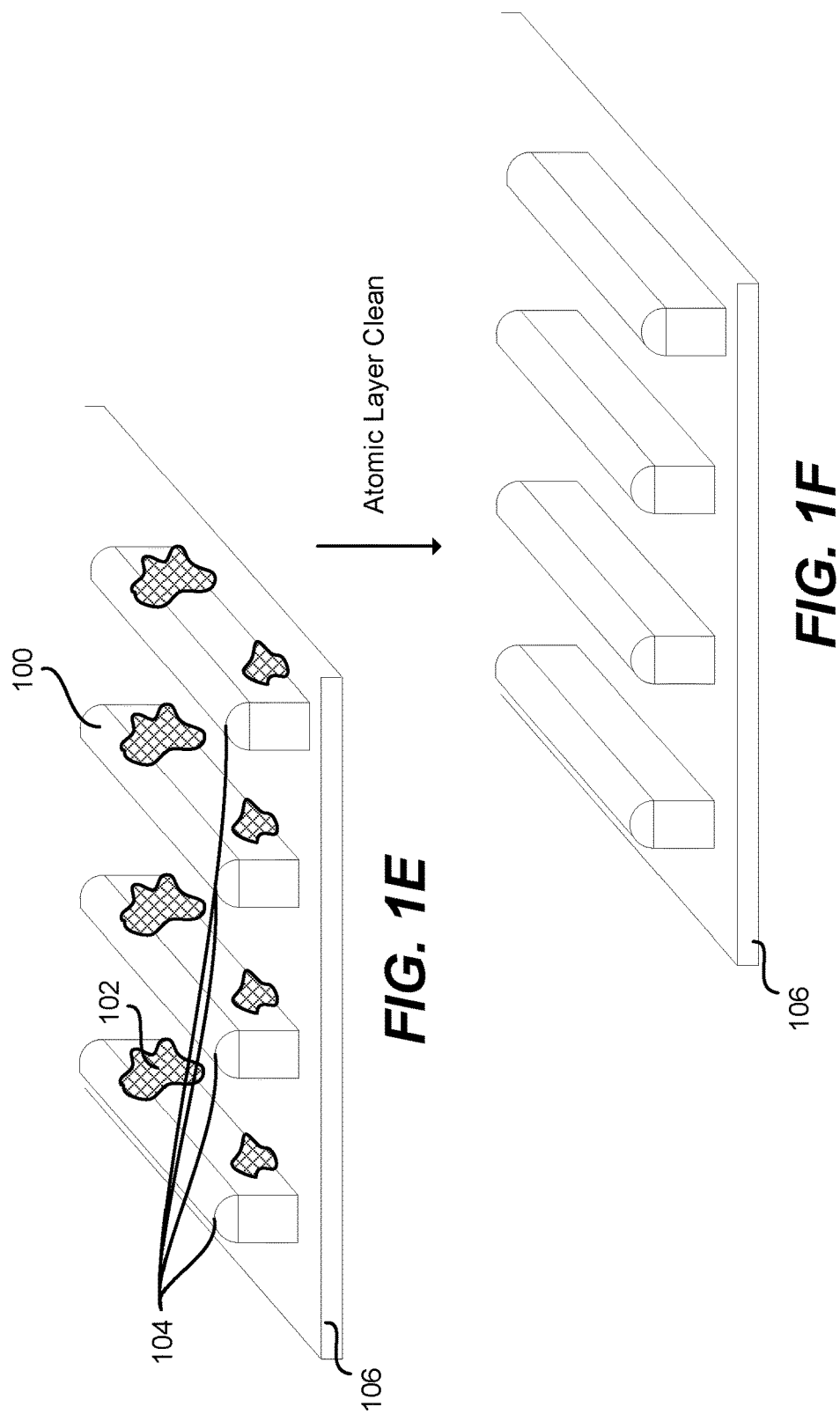

ATOMIC LAYER CLEAN FOR REMOVAL OF PHOTORESIST PATTERNING SCUM

CROSS REFERENCE TO RELATED APPLICATIONS

This application is a continuation in-part of and claims priority to U.S. patent application Ser. No. 15/582,359 entitled "ATOMIC LAYER ETCH METHODS AND HARDWARE FOR PATTERNING APPLICATIONS" filed on Apr. 28, 2017, the contents of which are incorporated by reference in their entirety.

BACKGROUND

Fabrication of integrated circuits often involves patterning of small features in high volume manufacturing of semiconductors. Incomplete ashing of material following lithographic processing of photoresist during patterning operations can leave residues, referred to as "scum," on patterning mandrel structures. Scum removal, or "descumming," without damaging other features or structures on a semiconductor substrate is desirable for patterning precision.

SUMMARY

Provided herein are methods of processing semiconductor substrates. One aspect involves a method of processing a semiconductor substrate, the method including: (a) providing to a chamber the semiconductor substrate comprising a carbon-containing material having a pattern of carbon-containing features; and (b) cleaning the carbon-containing features by an atomic layer cleaning (ALC) process to descum the carbon-containing features without substantially modifying feature critical dimensions, the ALC process comprising: (i) exposing the carbon-containing features to an oxidant or reductant in absence of a plasma or other energetic activation to modify scum on a surface of the carbon-containing features; and (ii) exposing the modified scum on the surface of the carbon-containing features to an inert gas and igniting a plasma at a pressure greater than 0.1 Torr and less than 10 Torr and a power of less than 200 W to remove the modified scum from the surface of the carbon-containing features.

In some embodiments, the oxidant is selected from a group consisting of: oxygen ($O_2$), nitrous oxide ($N_2O$), diols, water, ozone ($O_3$), alcohols, esters, ketones, carboxylic acids.

In some embodiments, dosing of the semiconductor substrate with the oxidant oxidatively saturates the semiconductor substrate to generate a saturated monolayer.

In some embodiments, exposure of the carbon-containing features to a reductant converts carbon in the carbon-containing features to a hydrocarbon having a chemical formula of $C_xH_y$ where x and y are integers greater than or equal to 1.

In some embodiments, the inert gas is selected from the group consisting of: helium, nitrogen, argon, and neon.

In some embodiments, the carbon-containing features comprise a material selected from a group consisting of: spin-on carbon, photoresist, or amorphous carbon.

The chamber may be set to a chamber pressure between about 0.1 Torr and about 0.5 Torr. In some embodiments, the plasma is ignited using a plasma power between about 10 W and 50 W.

The chamber may be purged with the inert gas or a vacuum after (b)(i). In some embodiments, purging the chamber removes any one or more selected from a group consisting of: oxidants, reducing agents, or liberated byproducts.

Exposing the modified surface of the carbon-containing features to the ignited plasma may energetically activate the saturated monolayer to liberate volatile byproducts. In some embodiments, the volatile byproducts are selected from a group consisting of: carbon monoxide (CO), carbon dioxide ($CO_2$), and hydrocarbons having a chemical formula of $C_xH_y$ such as methane ($CH_4$), acetylene ($C_2H_2$), ethylene ($C_2H_4$), or ethane ($C_2H_6$).

In some embodiments, methods of energetic plasma activation include that provided by a capacitively coupled reactor (CCP), inductively coupled reactor (ICP) or are thermal-based, ultraviolet-based, or photon-based.

The chamber may be purged with the inert gas or a vacuum after the energetic activation of the saturated monolayer by the ignited plasma to remove oxidants, reducing agents, or liberated byproducts.

In some embodiments, the scum on the surface of the carbon-containing features is less than 3 Å thick.

Another aspect involves an apparatus including one or more process chambers, where each process chamber has a chuck. The apparatus may further include one or more gas inlets into the process chambers and associated flow-control hardware, and a controller with a processor and a memory. The processor and the memory may be communicatively connected with one another. Also, the processor may be operatively connected with the flow-control hardware. The memory may store computer-executable instructions for controlling the processor to control the flow-control hardware by: dosing a semiconductor substrate housed within at least one of the process chambers with an oxidant or a reducing agent. Dosing with an oxidant may oxidatively saturate the semiconductor substrate to generate a saturated monolayer. Alternatively, dosing with the reductant may convert carbon-based materials in the semiconductor substrate to hydrocarbons with volatile byproducts. The instructions for controlling the processor to control the flow-control hardware may further include: purging the process chamber to remove the oxidant or the reducing agent, and/or to liberate the volatile byproducts; activating the saturated monolayer by applying a directional plasma thereto to remove the activated saturated monolayer; and purging the process chamber following the activation and removal of the saturated monolayer.

These and other aspects are described further below with reference to the drawings.

BRIEF DESCRIPTION OF THE DRAWINGS

FIGS. 1A-1I are schematic illustrations of semiconductor substrates in various stages of undergoing an atomic layer clean (ALC) process.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning of thin films in semiconductor processing is used in the manufacture and fabrication of semiconductor devices. Incomplete ashing of material following lithographic processing of photoresist during patterning operations can leave residues, referred to as "scum," on patterning mandrel structures. Scum removal, or "descumming," without damaging other features or structures on a semiconductor substrate is desirable for patterning precision. Descumming (or "descum") refers to a process of removing non-desirable carbon material from in between carbon-containing wafer features, such as patterning mandrel structures. Typically, patterning mandrels are carbon-based, and may be referred to as a photoresist (PR). Types of PR include negative, positive, extreme ultraviolet (EUV), or spin-on-carbon (SOC), or spin-on-hardmask (SOH). Scum, including footings, stringers, or other residual materials, poses a risk to patterning of semiconductor features, structures, or mandrels by connecting mandrel structures. Thus, removal of scum can improve patterning methods, such as double, quad, or multi-patterning applications.

Conventional techniques for removal of the scum may cause isotropic damage to the underlying carbon-containing features due to ion-induced damage, e.g., during a plasma application operation. Atomic layer cleaning (ALC), as described herein, offers a method to improve, or refine, the etch of a surface of a defined thickness on a carbon-containing feature, such as a PR mandrel. ALC leverages relationships between desired and non-desired reactions, e.g., damaging reactions such as ion-induced damage, defect generation, etc., which compete with desired reactions, to remove scum without damaging underlying carbon-containing features on the wafer.

Provided herein are methods of employing ALC for scum removal to improve patterning precision within a die, a wafer, and from lot-to-lot. Such techniques preferentially remove scum without substantially modifying feature critical dimensions. Disclosed embodiments remove PR scum to improve patterning fidelity.

Figure 1G:
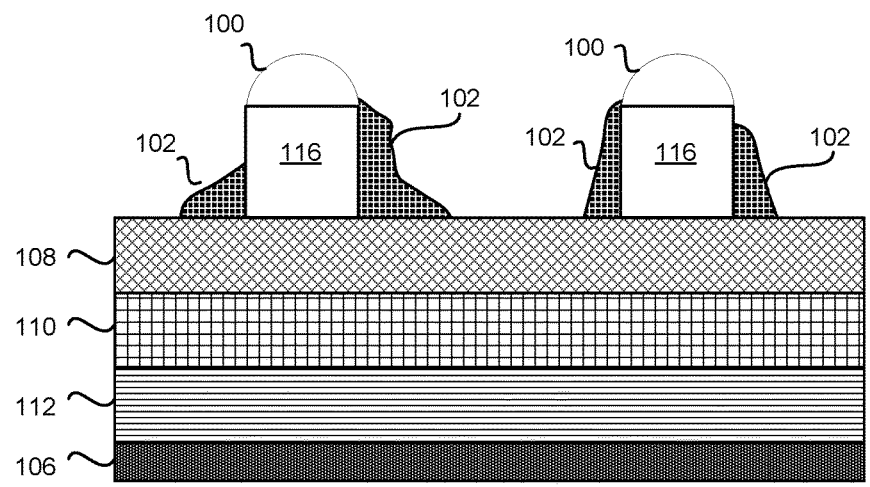

FIG. 1A shows a perspective view of a patterning mandrel structure, e.g., mandrel 100, with photoresist (PR) scum 102 on, or extending from, the mandrel 100. The scum 102 is removed by an atomic layer clean (ALC) process from the mandrel 100, as shown in FIG. 1B. FIGS. 1C and 1D show cross-sectional side views of an array 104 of mandrels 100 formed on a substrate 106. One of ordinary skill in the art will appreciate the substrate 106 may comprise a multi-layer stack suitable for semiconductor processing which may also include other layers, such as etch stop layers, cap layers, barrier layers, and other under-layers, as shown in more detail in FIG. 1G.

Non-desired carbon-based material, such as footings, stringers, or other forms of undesirable substrate surface roughness remaining on a substrate after lithography are collectively referred to herein as "scum," e.g., scum 102. In some embodiments, scum 102 may contain carbon at a level similar, or identical to, the mandrel 100, also referred to as a carbon-containing feature. As shown in FIG. 1C, several mandrels 100 may be oriented adjacent to one another in an array 104. Scum 102 may pose a patterning risk by remaining on substrate 106 after lithography to connect the mandrels 100, e.g. when organized, or positioned, in the array 104. Such a connection of the mandrels 100 by the scum 102 is undesirable, thus scum 102 is cleaned by an ALC process, for example as shown and described with reference to FIGS. 2-5, leaving array 104 of mandrels 100 free from scum 102, as shown in FIG. 1D.

In some embodiments, scum 102 is a residue of the PR development process that is relatively dispersed across the mandrel 100, as shown in FIG. 1A, and thus forms a thin layer on the mandrel. Such scum 102 thus has a relatively high surface area to volume ratio, and thus may be more susceptible to removal by an ALC process. Also, in some embodiments, scum 102 may be integrated with, or into, the mandrel 100, being formed of generally the same material as the scum 102. Thus, scum 102 may be thought to be an undesirable protrusion of the mandrel 100.

An understanding of ALC may be facilitated by an understanding of atomic layer etch (ALE) processes, described in U.S. patent application Ser. No. 15/494,245, entitled "ETCHING SUBSTRATES USING ALE AND SELECTIVE DEPOSITION" filed on Apr. 21, 2017, and U.S. patent application Ser. No. 15/582,359 entitled "ATOMIC LAYER ETCH METHODS AND HARDWARE FOR PATTERNING APPLICATIONS" filed on Apr. 28, 2017, both of which are incorporated by reference in their entireties. ALC may be repeated until desirable results are achieved, e.g., complete removal of scum 102 from on, or in between, mandrels 100 on substrate 106.

Intended use of ALC may differ from ALE, in that ALE typically may be conducted to reduce the critical dimension (CD) of a particular feature or structure on the substrate, such as mandrels 100 on substrate 106 shown in FIGS. 1A through 1D. Traditional lithographic processing techniques may be unable to precisely control CD as desired, thus ALE appropriately addresses that challenge. In contrast to ALE, ALC, as discussed herein, is primarily directed to clean, or remove, scum, such as scum 102, that may develop as a residue of the PR process.

Accordingly, ALC may employ process parameters and operations that emphasize directionality in ALC processes, to better target and remove scum from a substrate, or a feature thereon.

Figure 3:
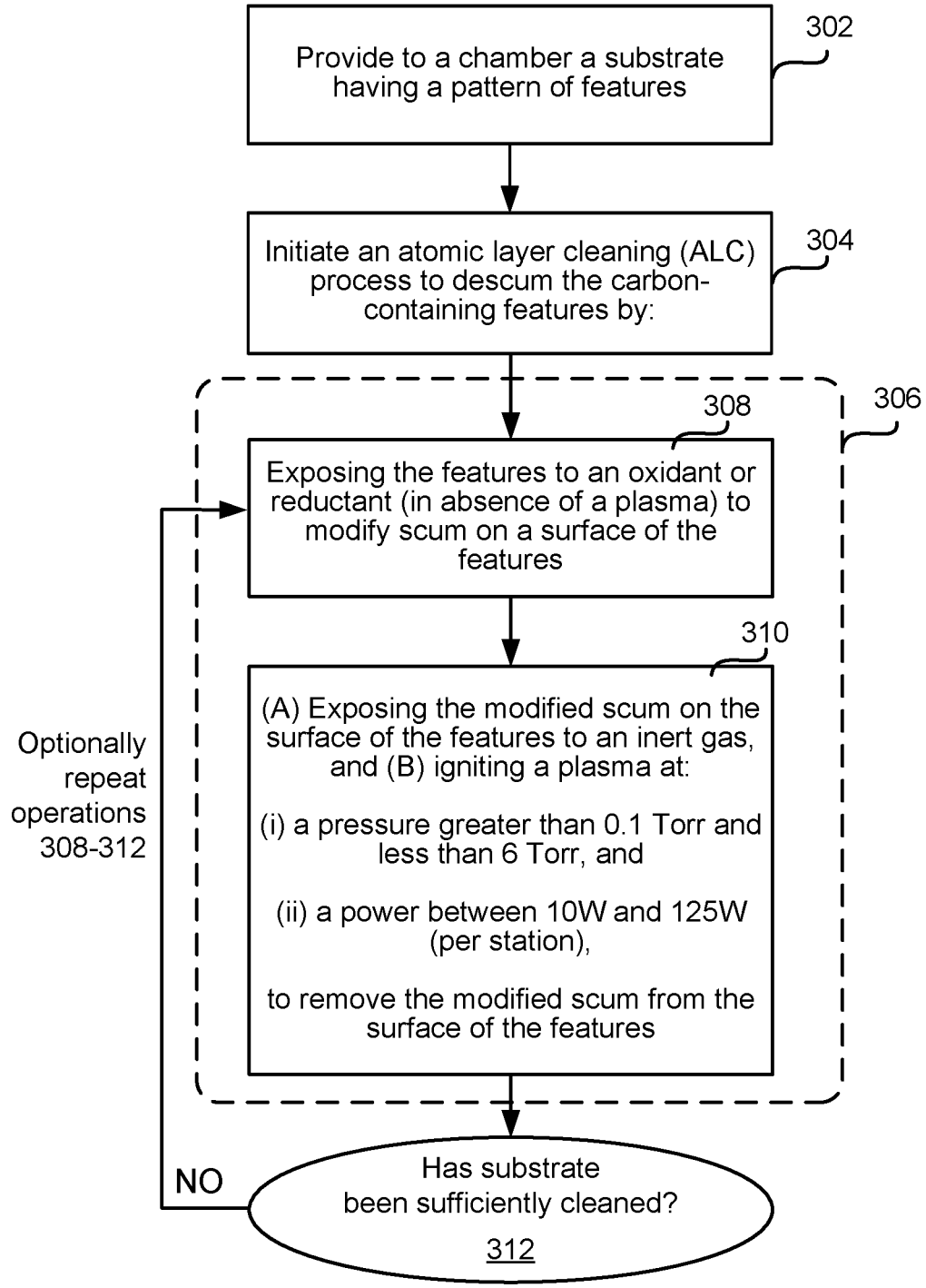
FIG. 3 is a process flow diagram of operations performed in accordance with disclosed embodiments.
Figure 4:
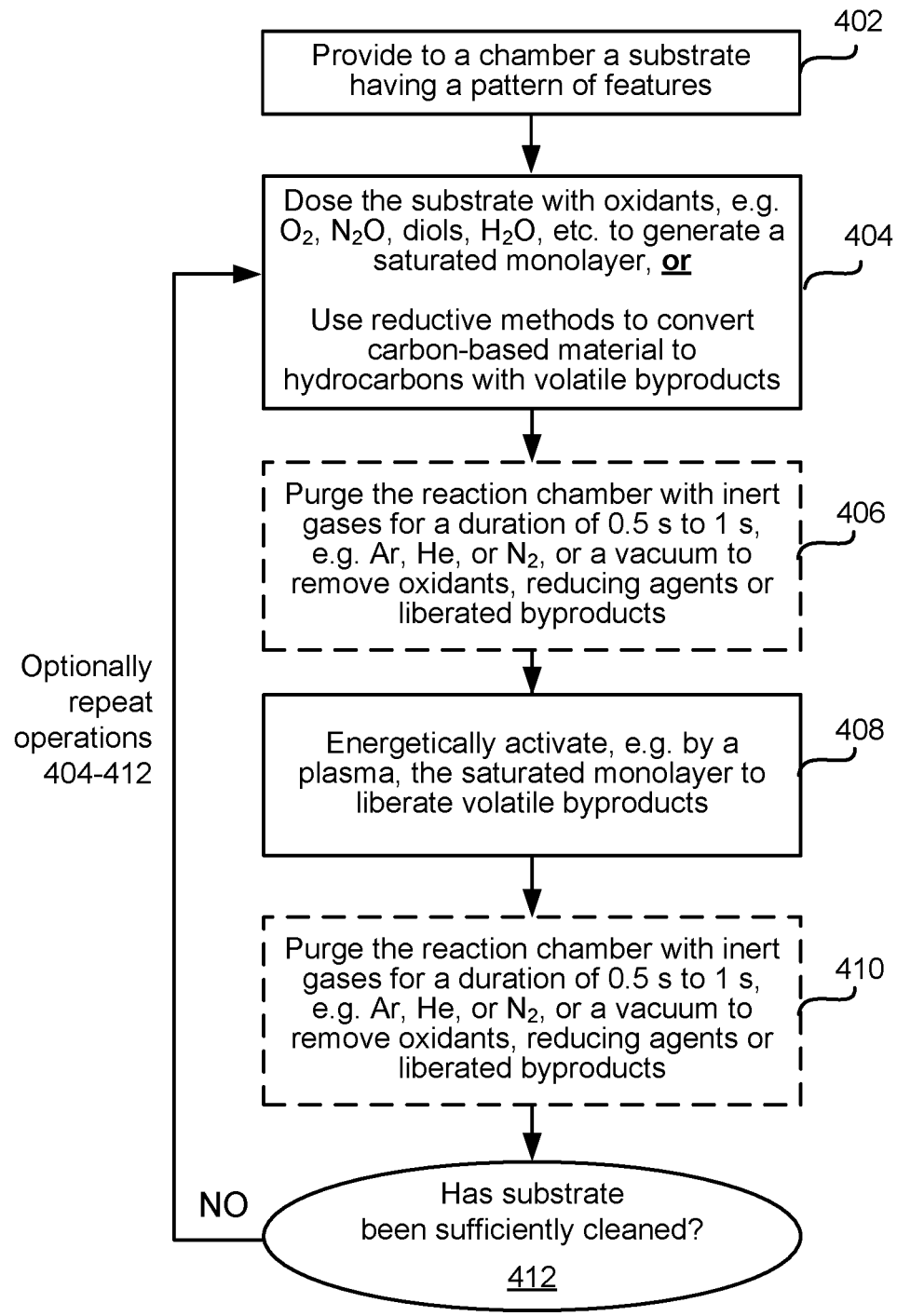
FIG. 4 is another process flow diagram of operations performed in accordance with disclosed embodiments.

In some embodiments, ALC may have a general process flow, further shown in FIGS. 3 and 4, involving exposing carbon-containing features, e.g., mandrels 100 on substrate 106, to an oxidant or reductant in absence of a plasma or other energetic activation. The carbon-containing features may include a material such as spin-on carbon, photoresist, and amorphous carbon. Exposure of the carbon-containing features to an oxidant or reductant modifies scum 102 on a surface of the carbon-containing features. In some embodiments, scum 102 identified for modification and subsequent removal may be less than a specified thickness, such as 3 Å, or within a range, such as between 2 Å to 20 Å. Modified scum on the surface of the mandrels 100, or substrate 106, is then exposed to an inert gas and a plasma ignited to remove the modified scum 102 from the surface of the mandrels 100, or substrate 106. In some embodiments, the plasma is applied at a pressure greater than 0.1 Torr and less than 10 Torr and a power of less than 200 W. Oxidants may be selected from a group consisting of: oxygen ($O_2$), nitrous oxide ($N_2O$), diols, water, ozone ($O_3$), alcohols, esters, ketones, and carboxylic acids. The inert gas may be selected from the group consisting of: helium, nitrogen, argon, neon and combinations thereof Dosing of the semiconductor substrate with the oxidant oxidatively saturates the substrate 106 surface, including the mandrels 100 on the substrate 106, to generate a saturated monolayer (not shown in FIGS. 1A-1G). In some embodiments, mandrels 100 may each generally have a critical dimension greater than 200 Å. The oxidant may saturate the substrate in an equivalent manner in topography to generate the saturated monolayer, which is later energetically activated upon exposure to the inert gas and plasma to liberate volatile byproducts, such as carbon monoxide (CO), carbon dioxide ($CO_2$), and methane ($CH_4$), to remove scum 102. Other volatile by products include carbon-containing species, which may have may have a chemical formula of CxHy, where x and y are integers greater than or equal to 1.

Alternatively, reductive methods may be employed to modify scum 102 comprising carbon-based materials, e.g., having carbon-carbon bonds, to hydrocarbons having a chemical formula of $C_xH_y$ such as methane ($CH_4$), acetylene ($C_2H_2$), ethylene ($C_2H_4$), or ethane ($C_2H_6$). Subsequent energetic activation of the hydrocarbons can liberate volatile byproducts for removal of scum 102 from mandrels 100 or substrate 106.

Either variant of the above-described ALC processes, e.g., dosing of the substrate with an oxidant to generate a saturated monolayer, or the usage of reductive methods to convert carbon in scum 102 to hydrocarbons, may descum carbon-containing features, e.g. mandrels 100 on substrate 106, without substantially modifying underlying feature critical dimensions.

Further, in some embodiments, ALC processes may involve one or more purges of a reaction chamber housing the substrate 106, with mandrels 100 extending therefrom, to remove oxidants, reductants or reducing agents, and liberated byproducts. For example, the reaction chamber may be purged with an inert gas after oxidant dosing of the substrate 106, or the usage of reductive methods to convert carbon-based materials to hydrocarbons with volatile byproducts, to remove oxidants, reductants or reducing agents, and liberated byproducts. The reaction chamber may again be purged with an inert gas after the energetic activation of the saturated monolayer, and removal of scum 102, to again remove oxidants, reductants or reducing agents, and liberated byproducts. ALC processes are shown and described in further detail with reference to FIGS. 3-5.

Returning to FIGS. 1C and 1D, mandrels 100 may be arranged in array 104. FIGS. 1E and 1F show variants of array 104 having additional mandrels 100. One of ordinary skill in the art will appreciate that various orientations, or configurations, of mandrels 100 on substrate 106 exist, and the ALC processes discussed herein may be employed to remove scum 102 from mandrels 100 across a variety of configurations.

FIG. 1G shows substrate 106 having a lithographically defined, or patterned, first core 116 on a second core 108, a third core 110, and a target layer 112. One of ordinary skill in the art will appreciate that a multi-layer stack suitable for semiconductor processing as described herein may also include other layers, such as etch stop layers, cap layers, barrier layers, and other under-layers.

Each mandrel 100 may include the patterned first core 116, which may comprise a carbon-containing and/or silicon-containing material. In some embodiments, the patterned first core 116 is a carbon-based photoresist (PR). The patterned first core 116 is lithographically defined and used to etch the second core 108. The second core 108 may be deposited by any suitable deposition technique, such as plasma enhanced chemical vapor deposition (PECVD). Deposition may involve generating a plasma in a deposition chamber from deposition gases including a hydrocarbon precursor, or reactant. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used.

In the embodiment depicted in FIG. 1G, under the second core 108 is the third core 110, which may also be a carbon-containing material deposited by PECVD.

Under the third core 110 is a target layer 112. In some embodiments, the target layer 112 may be the layer ultimately to be patterned, e.g., by patterning mandrel structures such as mandrels 100. The target layer 112 may be a semiconductor, dielectric, or other layer and may be made of silicon (Si), silicon oxide ($SiO_2$), silicon nitride (SiN), or titanium nitride (TiN), for example. The target layer 112 may be deposited by atomic layer deposition (ALD), plasma-enhanced ALD (PEALD), chemical vapor deposition (CVD), or other suitable deposition technique.

Figures 1H, 1I:
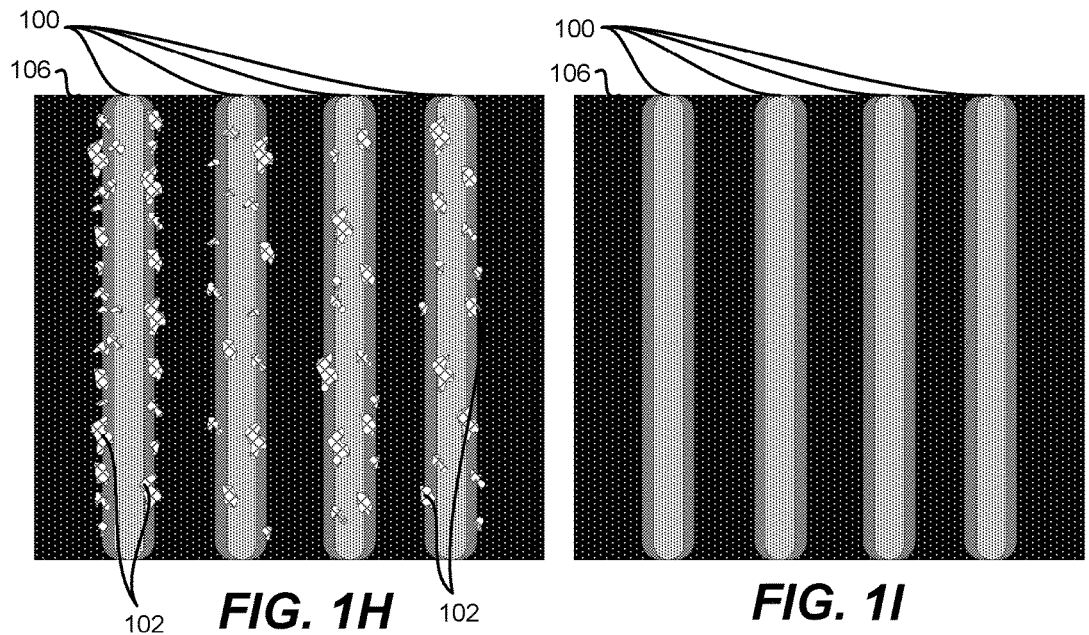

FIGS. 1H and 1I show top-down views of substrate 106. Lighter regions on mandrels 100 indicate raised surfaces relative to other areas. Application of ALC as discussed herein removes scum 102 from the mandrels 100, or from the wafer 106, resulting in cleaned mandrels 100, as shown in FIG. 1I.

Figure 2:
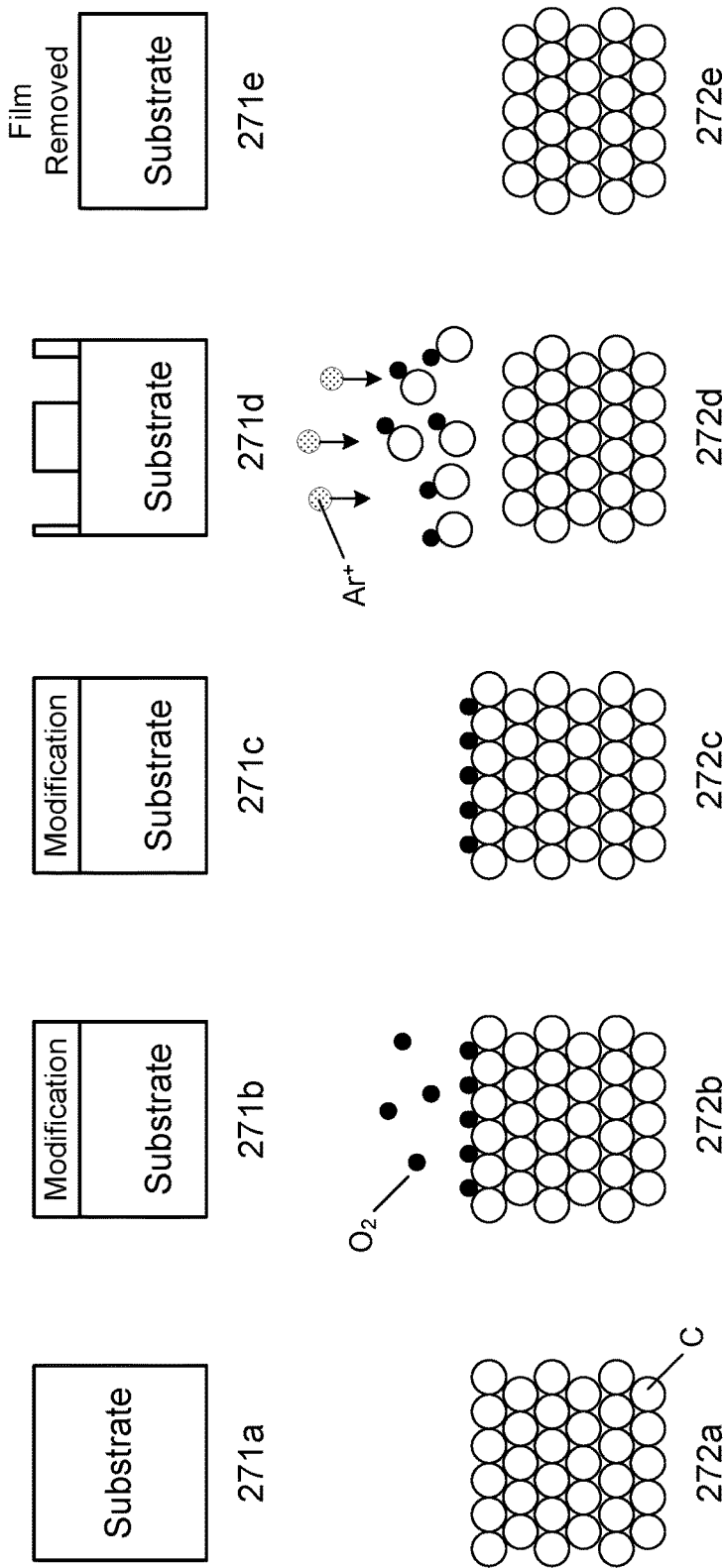
FIG. 2 is a schematic illustration of an example of an atomic layer etch (ALE) process.

FIG. 2 shows an exemplary atomic layer etch (ALE) technique for removing thin layers of material using sequential self-limiting reactions. ALC, as disclosed herein, is a development upon ALE and generally employs similar processes and principals to ALE, but requires specific process parameters, or conditions, to remove a desired thickness of material, e.g., such as less than 3 Å. A background knowledge of ALE is helpful to explain ALC.

Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example ALE and etching techniques. Examples of ALE techniques integrated with atomic layer deposition (ALD) techniques are described in U.S. Pat. No. 9,576,811, issued on Feb. 21, 2017 which is incorporated by reference herein. In various embodiments, ALE may be performed with plasma, or may be performed thermally.

ALE is performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts.

Generally, an ALE cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed non-conformally. FIG. 2 shows two example schematic illustrations of an ALE cycle. Diagrams 271a-271e show a generic ALE cycle. In 271a, the substrate is provided. In 271b, the surface of the substrate is modified. In 271c, the next operation is prepared. In 271d, the modified layer is being etched. In 271e, the modified layer is removed. Similarly, diagrams 272a-272e show an example of an ALE cycle for etching a carbon containing film. In 272a, a carbon containing substrate is provided, which includes many carbon atoms. In 272b, reactant gas oxygen ($O_2$) is introduced to the substrate which modifies the surface of the substrate. The schematic in 272b shows that some oxygen is adsorbed onto the surface of the substrate as an example. Although oxygen is depicted in FIG. 2, any oxygen-containing species or suitable reactant may be used. In 272c, the reactant gas oxygen is purged from the chamber.

In 272d, a removal gas argon is introduced with a directional plasma as indicated by the Ar+ plasma species and arrows, and ion bombardment is performed to remove the modified surface of the substrate. Although argon is depicted in FIG. 2, it will be understood that other removal gases may be used, such as helium, nitrogen, argon, and combinations thereof. During removal, a bias may be applied to the substrate to attract ions toward it. For ALC, bias is often applied to the substrate to attain a desired degree of ion directionality toward the substrate. Thus, ions may be targeted to effectively remove scum from the substrate. In 272e, the chamber is purged and the byproducts are removed.

A complete ALE cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may depend on the purpose of the etching; for example, the amount of material etched depends on the desired critical dimension of the layer, e.g. less than 3 Å, or within a range of 2 Å to 20 Å, to be etched using patterned carbon-containing material after etching the carbon-containing material to form the pattern.

FIG. 3 shows a process flow diagram for performing ALC operations in a method in accordance with certain disclosed embodiments. ALC, as shown in operation 306 in FIG. 3, generally occurs in a manner similar to ALE as shown in FIG. 2, but with the specific operational parameters, or conditions, described in operations 308 and 310. Namely, ALC requires exposure of the carbon-containing features on the semiconductor substrate to an oxidant, or reductant, in the absence of a plasma, as shown in operation 308. In contrast, earlier ALE methods typically involve modification of material on a surface of a feature with a chlorine-based material, rather than exposure to an oxidant, where such material is activated and volatilized to remove the material. Also, the modified surface, e.g., scum on the carbon-containing features, or mandrels 100, is removed by application of a plasma at the specific pressure and power settings indicated in operation 310. ALC further differs from ALE in that directional etch, or clean, of undesirable material, e.g., scum 102, is achieved by application of an anisotropic, or directional, plasma applied at a relatively low power. Low power, e.g., at a range of 10 W to 125 W, may allow for a controlled etch, or clean. Further, partial pressures of gas mixtures, such from He and $N_2$, employed to generate a plasma at operation 310 may be controlled, e.g., as a part of ALC, to achieve a desirable etch, or clean, profile. Generally, ALC processes are used to remove a thinner layer of undesirable material compared to ALE, e.g., less than 3 Å. Further, ALC processes may be applied using plasma at a higher pressure, relative to ALE, to achieve faster cycle times.

Operations in FIG. 3 may be performed at a chamber pressure of greater than about 100 mTorr and less than about 6 Torr, such as between about 0.5 Torr and about 6 Torr, or between about 1 Torr and about 4 Torr, or between about 1 Torr and about 2 Torr, for example. In operation 302, a substrate or wafer is provided to a processing chamber, such as a deposition chamber. The chamber may be a chamber in a multi-chamber apparatus or a single chamber apparatus, e.g. such as that shown by FIGS. 6 and 7. The substrate may be a silicon wafer, e.g., a 200 mm wafer, a 300 mm wafer, or a 450 mm wafer, including wafers having one or more layers of material, such as dielectric, conducting, or semi conducting material deposited thereon. The substrate may reside on a pedestal for holding the substrate. The pedestal may be set to a temperature between about 35° C. and about 100° C. This temperature may be referred to herein as the substrate temperature, though it will be understood that the substrate temperature is the temperature that the pedestal holding the substrate is set to.

In some embodiments, the substrate provided at operation 302 includes carbon-containing material, such as spin on carbon, amorphous carbon, or photoresist. The substrate may include a patterned mask layer previously deposited and patterned on the substrate.

In various embodiments, the layers on the substrate are patterned, e.g., to form mandrels 100 as shown in FIGS. 1A-1G. Substrates include "features," including carbon-containing features such as mandrels 100, which may be lithographically defined or may be patterned or etched as patterned core material from one or more previous etching processes. Lithographically defined means patterned by photolithography, such as 193 nm lithography, whereby patterns are printed by emitting photons from a photon source onto a mask and printing the pattern onto a photosensitive photoresist, thereby causing a chemical reaction in the photoresist that removes certain portions of the photoresist to form the pattern.

In some embodiments, the substrate provided to the chamber includes a lithographically defined pattern of carbon-containing features. Features as used herein refers to positive features of patterned carbon-containing material. Pitch is defined as the center-to-center distance between features. Features are spaced apart on the substrate surface, whereby the spaces between the features are referred to as "trenches" or "holes." In various embodiments, the substrate underlying the carbon-containing features may include an under layer, such as a barrier layer or adhesion layer. Non-limiting examples of underlayers include dielectric layers and conducting layers, e.g., silicon oxides, silicon nitrides, silicon carbides, metal oxides, metal nitrides, metal carbides, and metal layers.

In some embodiments, the features have aspect ratios of at least about 2:1, at least about 4:1, at least about 6:1, at least about 10:1, at least about 30:1, or higher. In some embodiments, the features have aspect ratios between about 6:1 and about 10:1. Disclosed methods may be performed on substrates with features where the widths of the openings of the trenches or holes between the features are less than about 150 nm.

Operation 304 initiates cleaning the features, e.g., mandrels 100, on the substrate by an ALC process, further described at operation 306, which includes both operations 308 and 310. In operation 308 of FIG. 3, the substrate is exposed to an oxidant, e.g., an oxygen-containing gas, without igniting a plasma to modify a surface of the carbon-containing material, e.g., on mandrels 100, on the substrate. The modification operation 308 forms a thin, reactive surface layer with a thickness, e.g., such as less than 3 Å, that is more easily removed than the un-modified material in a subsequent removal operation. Other suitable oxidants include, but are not limited to: nitrous oxide ($N_2O$) gas, diols, water, ozone, alcohols, esters, ketones, and carboxylic acids. Oxidant dosing of the substrate oxidatively saturates the substrate, e.g. in an equivalent manner in topography, to generate a saturated monolayer on the substrate. In some embodiments, a carbon-containing material in a substrate may be modified upon introduction of an oxidant into the chamber. Oxygen may be adsorbed onto the surface of the substrate without reacting with the carbon-containing material. Also, oxygen may be introduced into the chamber in a gaseous form and may be optionally accompanied by a carrier gas which may be any of helium, nitrogen, argon, neon and combinations thereof. In some embodiments, oxygen is introduced with nitrogen to the process chamber. Operation 304 may be performed for a duration sufficient to obtain complete saturation of the substrate surface with the oxygen containing gas. In some embodiments, the duration may be about 0.1 second. In some embodiments, the duration may be between about 0.1 seconds and about 5 seconds, such as about 0.5 second, or about 1 second.

As an alternative to dosing the substrate with an oxidant to modify scum as described above, in some embodiments, reductive methods may be employed to convert carbon-based, e.g. having carbon-carbon bonds, to hydrocarbons with volatile byproducts. However, in some embodiments, oxidizing agents tend to adsorb onto the surface of the substrate intended to be modified more uniformly than a reducing agent. The hydrocarbons released upon application of reductive methods may have a chemical formula of $C_xH_y$, where x and y are integers greater than or equal to 1, including $CH_4$, $C_2H_2$, $C_2H_4$, $C_2H_6$, etc.

In operation 310, the substrate, including the modified surface on a surface of the substrate and features thereon, is exposed to an inert gas and a plasma is ignited to remove the modified surface. The plasma applied in operation 310 may be a helium-containing, or helium-derived plasma with a frequency of 13.56 MHz or 27 MHz. Plasmas derived, or generated, from He or $N_2$ may also be employed. The selection of a plasma may be determined on the number of ligands, or co-ligands, associated with a plasma generated from a given gas. For instance, lower amounts of ligands, or co-ligands, tend to result in the plasma demonstrating relatively directional behavior. However, lower amounts of ligands, or co-ligands, may result in relatively energized ions, e.g. of the plasma, which thus etch more.

In some embodiments, frequencies of 400 kHz and 60 MHz may be employed to control ion energy. Also, optionally, pulsed plasma activation techniques and dual-frequency activation, e.g. tandem low and high frequency, may be employed. Plasma sources may include capacitively-coupled reactors (CCPs) or inductively coupled reactors (ICPs) as delivered from a SHD, or are thermal-based, ultraviolet-based, or photon-based.

The inert gas may be selected from a group including, but not limited to, Ar, He, $N_2$, or the substrate may be alternatively exposed to a vacuum. To remove scum modified upon exposure to an oxidant, or reductant, as shown in operation 308 the surface of the features, the substrate may be exposed to an energy source at operation 310. Suitable energy sources may include activating or sputtering gases or chemically reactive species that induce removal, such as argon or helium, to etch (or clean) the substrate by directional sputtering. In some embodiments, the removal operation may be performed by ion-bombardment. In operations 302-312, bias is not applied to modulate the directionality of etching to achieve a desired profile. Rather conformal etching, or cleaning by ALC to remove scum from the surface of the features, may be achieved without applying a bias.

The amount of sputtering gas may be controlled to etch, or clean, only a targeted amount of material, such as less than 3 Å, or within a specified range of 2 Å to 20 Å. For example, sputtering gases such as helium and nitrogen may be flowed to a process chamber at 10,000 sccm and 9,000 sccm, respectively. Further, the etch (or clean) profile of the substrate may be controlled by modifying the ratio of helium to nitrogen. In some embodiments, the pressure of the chamber may vary between modification and removal operations. The pressure of the gas may depend on the size of the chamber, the flow rate of the gas, the temperature of the reactor, the type of substrate, and the size of substrate to be etched. In some embodiments, higher pressure of the gas may allow for relatively faster cycle completion times. As shown in FIG. 3, plasma is ignited at a pressure greater than 0.1 Torr and less than 10 Torr.

Plasma is ignited at a plasma power selected to reduce sputtering of the material on the substrate surface while controlling the amount of material etched in each cycle. For a four station chamber (such as to process four substrates simultaneously), the plasma power may be between about 250 W and about 750 W. In some embodiments, the plasma power for a single substrate station may be between about 50 W and about 250 W. Although the use of plasma may cause some sputtering in general, sputtering is generally controlled by performing disclosed embodiments at a high pressure with low plasma power to obtain fine-tuned control over the amount of material etched, or cleaned, per cycle and to thereby pattern carbon-containing material to obtain vertical, or clean, feature sidewalls. For example, in some embodiments, the chamber pressure may be about 2 Torr with plasma power per substrate station between about 50 W and about 250 W. As shown in FIG. 3, plasma power per substrate station is less than 200 W, such as between 10 W and 200 W per station. In some embodiments, the plasma may be ignited for a duration of less than about 5 seconds, such as between about 1 second and about 5 seconds.

In operation 312, it is determined whether the substrate has been sufficiently etched, or cleaned. If not, operations 308-312 may be optionally repeated. Performing operation 306 may constitute one ALC cycle. In various embodiments, etching, or cleaning, may be performed in cycles. The number of cycles depends on the amount of etching, or cleaning, desired for the particular application. In various embodiments, between about 1 cycle and about 100 cycles may be used. In some embodiments, about 5 cycles to about 100 cycles may be used. In some embodiments the number of cycles may be about 1 to about 40 cycles, or about 1 to about 20 cycles, or about 30 to about 40 cycles. Any suitable number of ALC cycles may be included to etch, or clean, a desired amount of film. In some embodiments, ALC is performed in cycles to etch about 1 Å to about 50 Å of the surface of the layers on the substrate. In some embodiments, cycles of ALC etch between about 2 Å and about 50 Å of the surface of the layers on the substrate. In some embodiments, the number of cycles may be selected by using optical emission spectroscopy (OES) to identify the amount of etch and set an endpoint to stop etching at the endpoint. In some embodiments, the cycle time (duration for a single cycle) may be less than 1 second. ALC, as presented and discussed in FIG. 3 or 4, may be conducted at an etch rate of 0.5 Å to 2 Å per cycle. Many ALE processes more typically remove from about 4 Å to 10 Å per cycle.

As introduced earlier, directionality of ALC processes may assist in the efficient targeting and removal of scum 102 from mandrels 100, or the substrate 106, as shown in FIGS. 1A through 1 F. For example, in some embodiments, highly directional ALC may be applied to a substrate to preferentially etch the exposed field region of the substrate without etching sidewalls of features on the substrate. Specific process conditions, or parameters, such as the uniformity, smoothness and selectivity of ALC processes may be quantified as a percentage of the total amount of material removed per cycle, defined as "ALC synergy" and shown in the equation below:

$$ALC \text{ synergy } \% \ (S) = \frac{EPC - (\alpha + \beta)}{EPC} \times 100\%$$

EPC is defined as "etch per cycle," and represents the total thickness of material removed in one cycle of ALC and may be averaged over many cycles. The values of "$\alpha$" and "$\beta$" are undesirable contributions from individual ALC operations, and also have units of nm/cycle. $\alpha$ is the value of an undesirable contribution from surface modification, e.g. the chemical modification of the surface by neutral reactants, such as that shown in operation 308. $\beta$ is the value of an undesirable contribution from removal of the modified layer by inert ion energy, e.g. as that shown by operation 310 in FIG. 3. Under ideal operating conditions, synergy will approach 100% with no etching from either step alone. Typically, as observed in practice, non-zero contributions from $\alpha$ and $\beta$ may be present due to photon-induced etching, physical sputtering, step contamination, and/or competing reactions of conventional etching. Chemical modification of the surface and removal of the modified layer by inert ion energy may be performed as independent processes to experimentally measure quantities of $\alpha$ and $\beta$.

Study of ALC synergy, as defined above, may assist in the fine tuning and directionality of ALC process parameters as needed to remove less than 3 Å of scum from the surface of the features as discussed in operation 306. Adjustment of ALC process parameters, or conditions, such as plasma pressure, power, and frequency may influence the relatively directionality of etch, or clean, achieved per cycle. Generally, more directional, or anisotropic, etch is desired to avoid etching of feature sidewalls. Further, parameters may be tuned to preferentially etch area in between features on the substrate, such as the "field." Alternatively, information provided by synergy may be considered when balancing etch, or clean, of the field relative to scum on the features themselves.

FIG. 4 shows another variant of an exemplary ALC process involving multiple purge operations to remove species from the process chamber. Operations 402-412 may be completed at similar, or identical, pressure and temperature ranges as described for operations 302-312. The reaction chamber is purged at operations 406 and 410 after dosing of the substrate with oxidants at operation 404 and after the energetic activation of the saturated monolayer at operation 408, respectively. In some embodiments, the reaction chamber may be purged at operations 406 and 410 for a specified duration, such as for between 0.5 second to 1 second. The reaction chamber may be purged at operations 406 and 410 with inert gases, such as Ar, He, $N_2$, and Ne, or a vacuum, to remove oxidants, reducing agents or liberated byproducts. Operations 404-412, including purge operations 406 and 410, may be repeated as necessary to remove a specified thickness of material.

Although any one or more of Ar, He, $N_2$, and Ne, or a vacuum, may be employed to remove oxidants, reducing agents, or liberated byproducts, the relative large size of Ar atoms may make conducting a purge operation with Ar (gas) more difficult to control, relative to a purge conducted with He, $N_2$, or Ne. Purges with Ar gas may thus also tend to demonstrate lesser directionality and result in more feature sidewall damage.

Figure 5:
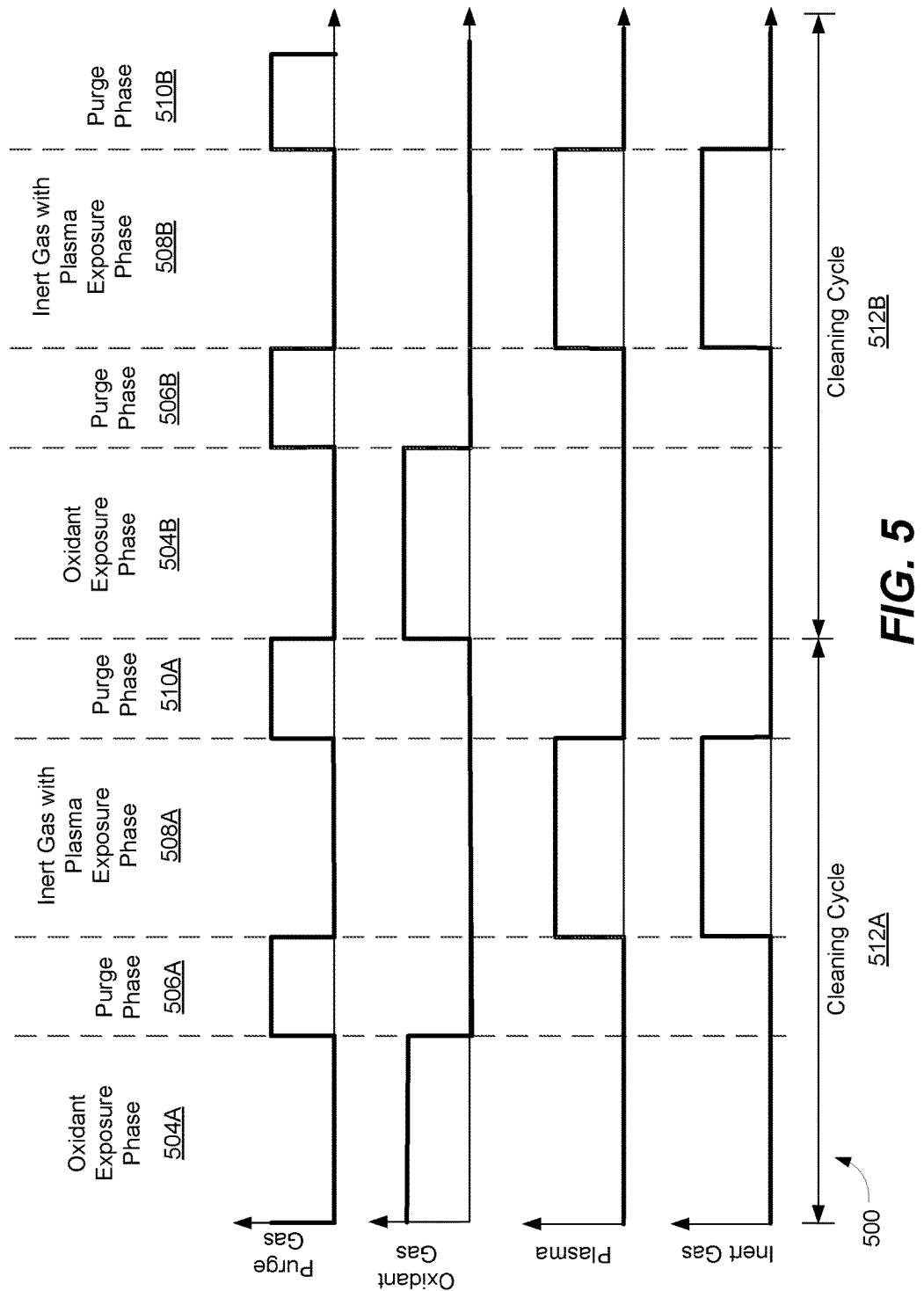
FIG. 5 is a timing schematic diagram depicting an example of ALC operations performed in accordance with certain disclosed embodiments.

FIG. 5 is a timing schematic diagram depicting an example of ALC operations performed in accordance with certain disclosed embodiments. The phases shown in FIG. 5 may generally correspond with operations 404-410 shown in FIG. 4. In the example provided in FIG. 5, a process 500 includes two cleaning cycles 512A and 512B. Cleaning cycle 512A includes oxidant gas, such as an oxygen-containing gas, exposure phase 504A, purge phase 506A, inert gas with plasma exposure phase 508A, and purge phase 510A. During oxidant exposure phase 504A, which may correspond to operation 308 of FIG. 3, purge gas flow is turned off, plasma is turned off, inert gas flow in this example is turned off, and oxygen-containing gas flow is turned on. Note that while inert gas flow is depicted as being turned off, in some embodiments a carrier gas, which may be an inert gas, may be flowed with the oxygen containing gas. In some embodiments, the carrier gas is diverted prior to delivery of oxygen containing gas to the processing chamber.

Following oxygen-containing gas exposure phase 504A, purge phase 506A is optionally performed, which may correspond to operation 406 of FIG. 4. During purge phase 506A, a purge gas is flowed, while oxygen containing gas and inert gas flows are turned off and plasma is turned off. Note that while purge gas and inert gas are listed separately in FIG. 3, in some embodiments, the same gas may be used as a purge gas and as an inert gas used in inert gas with plasma exposure phase 508A. During inert gas with plasma exposure phase 508A, purge gas flow is turned off as well as oxygen containing gas flow, while an inert gas flow is turned on and plasma is turned on. This phase may correspond to operation 310 of FIG. 3. A bias is not applied during inert gas with plasma exposure phase 508A. A bias is not applied during oxygen containing gas exposure phase 504A either. In purge phase 510A, which may correspond to operation 410 of FIG. 4, purge gas is flowed while oxygen containing gas flow and inert gas flows are turned off and plasma is turned off. Etching cycle 512A may be repeated as shown in cleaning cycle 512B, which includes oxygen containing gas exposure phase 504B, purge phase 506B, inert gas with plasma exposure phase 508B, and purge phase 510B.

During oxygen containing gas exposure phase 504B, purge gas flow and inert gas flows are turned off, while oxygen-containing gas flow is turned on and plasma is turned off. During purge phase 506B, purge gas flow is turned on while oxygen-containing gas flow and inert gas flows are turned off and plasma is also turned off. During inert gas with plasma exposure phase 508B, purge gas flow and oxygen containing gas flows are turned off while inert gas flow is turned on and plasma is also turned on. During purge phase 510B, purge gas flow is turned on, while oxygen-containing gas flow and inert gas flows are turned off, and plasma is turned off. Although two cleaning cycles are depicted in FIG. 5, it will be understood that additional cleaning cycles may also be performed.

Apparatus

Figure 6:
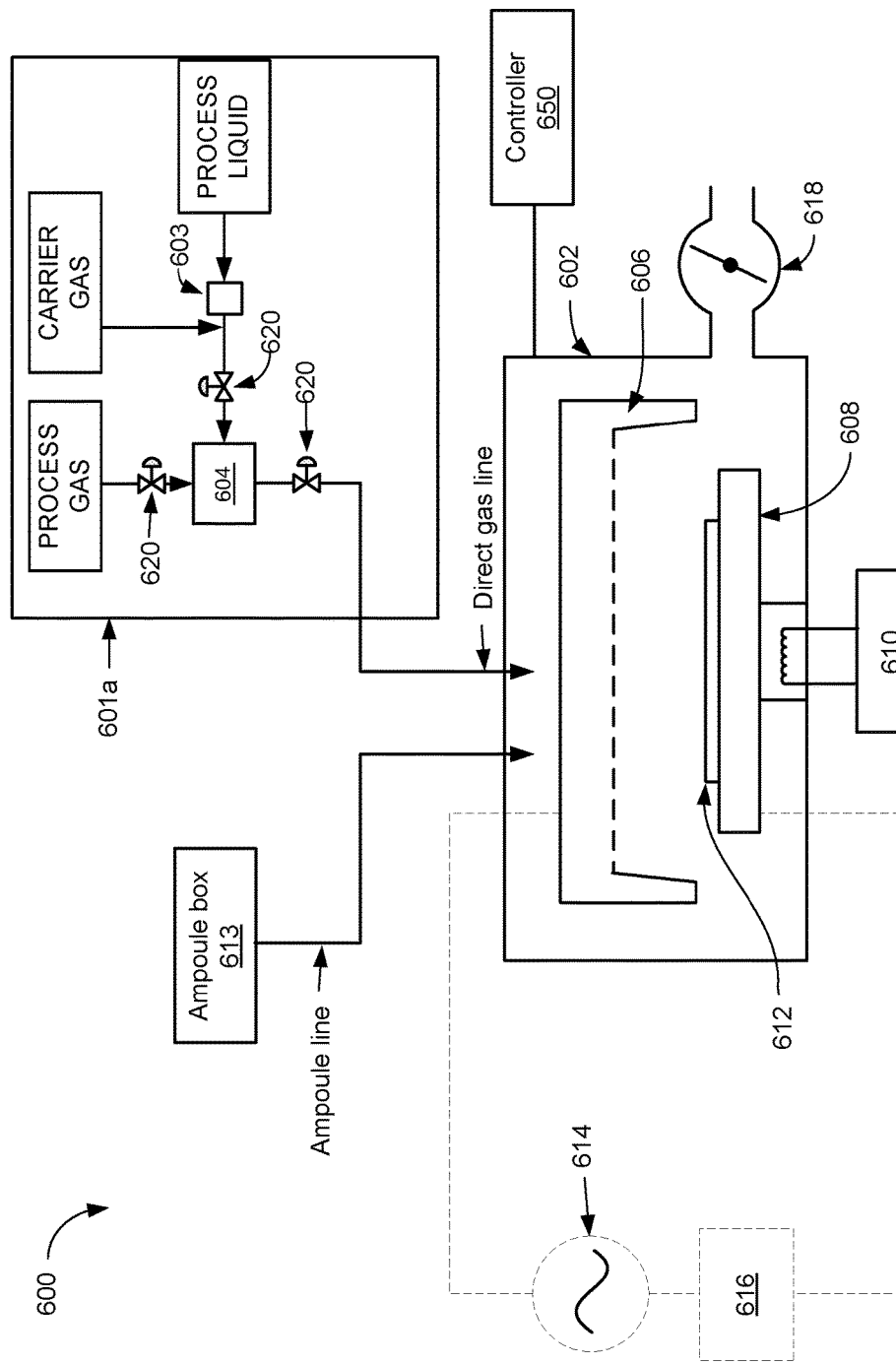
FIG. 6 is a schematic diagram of an example process tool for performing certain disclosed embodiments.

FIG. 6 depicts a schematic illustration of an embodiment of an atomic layer cleaning (ALC) process station 600 having a process chamber 602. The process station 600 may be used for performing certain disclosed embodiments. For example, while process station 600 may typically be used to deposit films by atomic layer deposition (ALD) on a substrate, process station 600 may be used in certain disclosed embodiments to clean carbon-containing material in a patterning scheme by ALC as described elsewhere herein. In some embodiments, process station 600 may be used for both ALC and ALD, or in some embodiments, several process stations in a multi-station tool may include a station for ALC and a station for ALD such that substrates may be transferred between an ALC station and ALD station without breaking vacuum.

Figure 7:
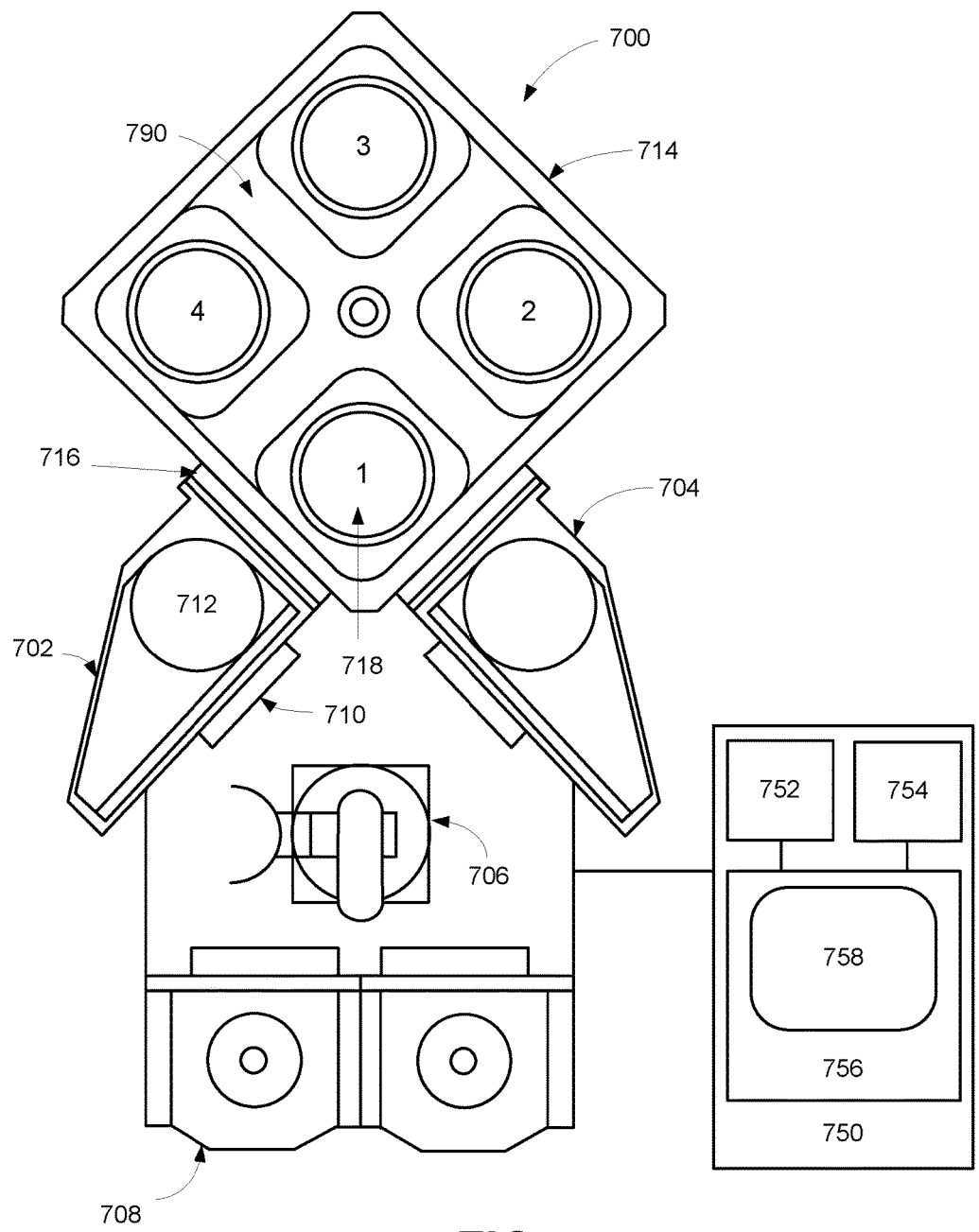
FIG. 7 is a schematic diagram of another example process tool for performing certain disclosed embodiments.

Process chamber 602 may be used for maintaining a low-pressure environment. A plurality of process stations may be included in a common low pressure process tool environment. For example, FIG. 7 depicts an embodiment of a multi-station processing tool 700. In some embodiments, one or more hardware parameters of process station 600, including those discussed in detail below, may be adjusted programmatically by one or more computer controllers 650.

Process station 600 fluidly communicates with reactant delivery system 601a for delivering process gases to a distribution showerhead 606. Reactant delivery system 601a includes a mixing vessel 604 for blending and/or conditioning process gases, such as an oxygen-containing gas, or inert gas, for delivery to showerhead 606. One or more mixing vessel inlet valves 620 may control introduction of process gases to mixing vessel 604.

As an example, the embodiment of FIG. 6 includes a vaporization point 603 for vaporizing liquid reactant to be supplied to the mixing vessel 604. In some embodiments, deposition chemistry may be provided as a vaporized liquid reactant. Deposition chemistry may be used following performing ALC in process chamber 602 to form a patterned carbon-containing material such that a conformal film may be deposited by ALD over the patterned carbon-containing material. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, a liquid precursor or liquid reactant may be vaporized at a liquid injector (not shown in FIG. 6). For example, a liquid injector may inject pulses of a liquid reactant into a carrier gas stream upstream of the mixing vessel 604. In one embodiment, a liquid injector may vaporize the reactant by flashing the liquid from a higher pressure to a lower pressure. In another example, a liquid injector may atomize the liquid into dispersed micro-droplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process chamber 602. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a chuck or pedestal 608. The showerhead 606 may be positioned at a distance of between 350 mils (0.35 in.) to 700 mils (0.7 in.) to attain a desirable level of directionality of ions provided, or dispersed, by showerhead 606 toward substrate 612. In some embodiments, a lower, or lesser, gap between showerhead 606 and pedestal 612 may be employed to retain directionality of ions dispersed from showerhead 606. However, at low pressure conditions (e.g. below 10 mT, or 0.01 Torr) a higher, or larger, gap may be needed to achieve stable dispersion of ionized plasma from showerhead 606. In some embodiments, a chamber may include multiple chucks or pedestals. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. In some embodiments, pedestal 608 may be temperature controlled via heater 610. Pedestal 608 may be set to any suitable temperature, such as between about 25° C. and about 650° C. or between about 35° C. and about 100° C. during operations for performing various disclosed embodiments. It will be appreciated that, in some embodiments, pedestal height may be adjusted programmatically by a suitable computer controller 650.

In another scenario, adjusting a height of pedestal 608 may allow a plasma density to be varied during plasma activation performed in certain disclosed embodiments. For example, plasma may be ignited when an inert gas is flowed to the substrate 612 via showerhead 606 to remove modified core material after the core material is exposed to an oxygen-containing gas. At the conclusion of a process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 7.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. In some embodiments, an OES sensor may be used to set an endpoint to stop etching after a certain amount of time using certain disclosed embodiments. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., oxygen-containing gas), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second gas such as argon, instructions for modulating the flow rate of a carrier or purge gas, instructions for igniting a plasma at low plasma power between about 250W and about 750W for a four-station processing tool, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. Such recipes may be used to etch carbon-containing material such as core material on a substrate to yield vertical sidewalls that meet the surface of an underlying layer to be etched at a point at about 90°±5°. Additional recipes may also follow and may be used to deposit a conformal film over the patterned core material by ALD. For example, for depositing a silicon oxide conformal film over a patterned core material, one additional recipe phases may include instructions for setting a flow rate of a silicon-containing precursor, and another additional recipe phase may include instructions for setting a flow rate of an oxygen-containing reactant and time delay instructions for the additional recipe phase. It will be appreciated that these recipe phases may be further subdivided and/or iterated in any suitable way within the scope of the present disclosure.

Further, in some embodiments, pressure control for process station 600 may be provided by butterfly valve 618. As shown in the embodiment of FIG. 6, butterfly valve 618 throttles a vacuum provided by a downstream vacuum pump (not shown in FIG. 6). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source (not shown in FIG. 7). A robot 706, at atmospheric pressure, is configured to move wafers from a cassette loaded through a pod 708 into inbound load lock 702 via an atmospheric port 710. A wafer (not shown in FIG. 7) is placed by the robot 706 on a pedestal 712 in the inbound load lock 702, the atmospheric port 710 is closed, and the load lock inbound 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALC, an ALD and plasma-enhanced ALD process mode. In some embodiments, exposure to a deposition precursor and exposure to a second reactant and plasma are performed in the same station. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer clean (ALC) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrate, the method comprising:
   (a) providing to a chamber the semiconductor substrate comprising a carbon-containing material having a pattern of carbon-containing features, the carbon-containing features having on a surface a non-desirable carbon-containing residue resulting from incomplete ashing of material following lithographic processing of photoresist during prior patterning operations conducted on the carbon-containing material; and
   (b) cleaning the carbon-containing features by an atomic layer cleaning (ALC) process to remove the non-desirable carbon-containing residue (scum) from the carbon-containing features without substantially modifying critical dimensions of the carbon-containing features, the ALC process comprising:
      (i) exposing the carbon-containing features to an oxidant or reductant in absence of a plasma or other energetic activation to modify the scum on the surface of the carbon-containing features; and
      (ii) exposing the modified scum on the surface of the carbon-containing features to an inert gas and igniting a plasma at a pressure greater than 0.1 Torr and less than 6 Torr and a power of less than 125 W to remove the modified scum from the surface of the carbon-containing features.

2. The method of claim 1, wherein the oxidant is selected from a group consisting of: oxygen ($O_2$), nitrous oxide ($N_2O$), diols, water, ozone ($O_3$), alcohols, esters, ketones, carboxylic acids.

3. The method of claim 2, wherein dosing of the semiconductor substrate with the oxidant oxidatively saturates the semiconductor substrate to generate a saturated monolayer.

4. The method of claim 1 wherein (b)(i), exposure of the carbon-containing features to a reductant converts carbon in the carbon-containing features to a hydrocarbon having a chemical formula of $C_XH_Y$ where x and y are integers greater than or equal to 1.

5. The method of claim 1, wherein the inert gas is selected from the group consisting of: helium, nitrogen, argon, neon and combinations thereof.

6. The method of claim 1, wherein the carbon-containing features comprise mandrel structures comprising a material selected from the group consisting of spin-on carbon, photoresist, and amorphous carbon.

7. The method of claim 1, wherein the chamber is set to a chamber pressure between about 0.1 Torr and about 0.5 Torr.

8. The method of claim 1, wherein the plasma is ignited using a plasma power between about 10 W and 50 W.

9. The method of claim 1, wherein the chamber is purged with the inert gas or a vacuum after (b)(i).

10. The method of claim 9, wherein purging the chamber removes any one or more selected from a group consisting of: oxidants, reducing agents, or liberated byproducts.

11. The method of claim 3, wherein exposing the carbon-containing features to the ignited plasma energetically activates the saturated monolayer to liberate volatile byproducts.

12. The method of claim 11, wherein the volatile byproducts are selected from a group consisting of: carbon monoxide (CO), carbon dioxide ($CO_2$), and hydrocarbons having a chemical formula of $C_XH_Y$.

13. The method of claim 11, wherein methods of energetic plasma activation include that provided by a capacitively coupled reactor (CCP), inductively coupled reactor (ICP) or are thermal-based, ultraviolet-based, or photon-based.

14. The method of claim 11, wherein the chamber is purged with the inert gas or a vacuum after the energetic activation of the saturated monolayer by the ignited plasma to remove oxidants, reducing agents, or liberated byproducts.

15. The method of claim 1, wherein the scum on the surface of the carbon-containing features is less than 3 Å thick.

16. The method of claim 1, wherein completing claim 1 (b)(i) and claim 1 (b)(ii) comprises an etch cycle which removes 0.5 Å to 2 Å of the modified scum per cycle.

17. An apparatus for processing a semiconductor substrate, comprising:
   one or more process chambers, each process chamber having a chuck;
   one or more gas inlets into the process chambers and associated flow-control hardware; and
   a controller having a processor and a memory, wherein the processor and the memory are communicatively connected with one another, the processor is at least operatively connected with the flow-control hardware, and the memory stores computer-executable instructions for controlling the processor to at least control the flow-control hardware by:
      cleaning a semiconductor substrate comprising a carbon-containing material having a pattern of carbon-containing features housed within at least one of the process chambers
      by an atomic layer cleaning (ALC) process to remove non-desirable carbon material (scum) from the carbon-containing features without substantially modifying feature critical dimensions, the ALC process comprising:
         exposing the carbon-containing features to an oxidant or reductant in absence of a plasma or other energetic activation to modify scum on a surface of the carbon-containing features; and
         exposing the modified scum on the surface of the carbon-containing features to an inert gas and igniting a plasma at a pressure greater than 0.1 Torr and less than 6 Torr and a power of less than 125 W to remove the modified scum from the surface of the carbon-containing features.

18. The method of claim 1, wherein the scum comprises undesirable surface roughness remaining on the surface of the carbon-containing features after lithography.

19. The method of claim 18, wherein the scum comprises footings or stringers.

20. The method of claim 19, wherein the footings or stringers have a higher surface area to volume ratio than the carbon-containing features.

* * * * *